United States Patent [19]
Aronowitz et al.

[11] Patent Number: 5,357,135
[45] Date of Patent: Oct. 18, 1994

[54] DMOST JUNCTION BREAKDOWN ENHANCEMENT

[75] Inventors: Sheldon Aronowitz, San Jose; George P. Walker, Capitola; Peter Meng, Sunnyvale; Farrokh Mohammadi, Los Altos; Bhaskar V. S. Gadepally, San Jose, all of Calif.

[73] Assignee: National Semiconductor Corporation, Santa Clara, Calif.

[21] Appl. No.: 198,686

[22] Filed: Feb. 18, 1994

Related U.S. Application Data

[63] Continuation of Ser. No. 822,333, Jan. 16, 1992, abandoned.

[51] Int. Cl.$^5$ .................... H01L 29/10; H01L 29/78
[52] U.S. Cl. ................................ 257/369; 257/339
[58] Field of Search ............... 357/23.4; 257/339, g31

[56] References Cited

U.S. PATENT DOCUMENTS 3,921,199 11/1975 Yuan et al. ........................ 257/495
4,743,952 5/1988 Baliga ............................ 357/23.4

Primary Examiner—Andrew J. James
Assistant Examiner—Stephen D. Meier
Attorney, Agent, or Firm—Skjerven, Morrill, MacPherson, Franklin & Friel

[57] ABSTRACT

Body to drain junction breakdown, due to avalanching in DMOST devices, can be controlled. The invention lowers the electric field gradients in the vicinity of the PN junction. The structure employed to enhance breakdown behavior is specifically applied to a vertical DMOST. The N type doping profile in the vicinity of the body to drain junction is tailored by constructing a P-nu-N-N+ type diode structure where nu is a low N type impurity concentration region. The N type region is of higher impurity concentration and is more extensive. With the nu region having one-half of the impurity concentration of the N region and an extent of about two microns, the avalanche breakdown voltage is about 27% higher than the conventional PN junction diode. By making the nu region impurity concentration one-fourth that of the N region, the breakdown voltage is 40% higher.

9 Claims, 4 Drawing Sheets

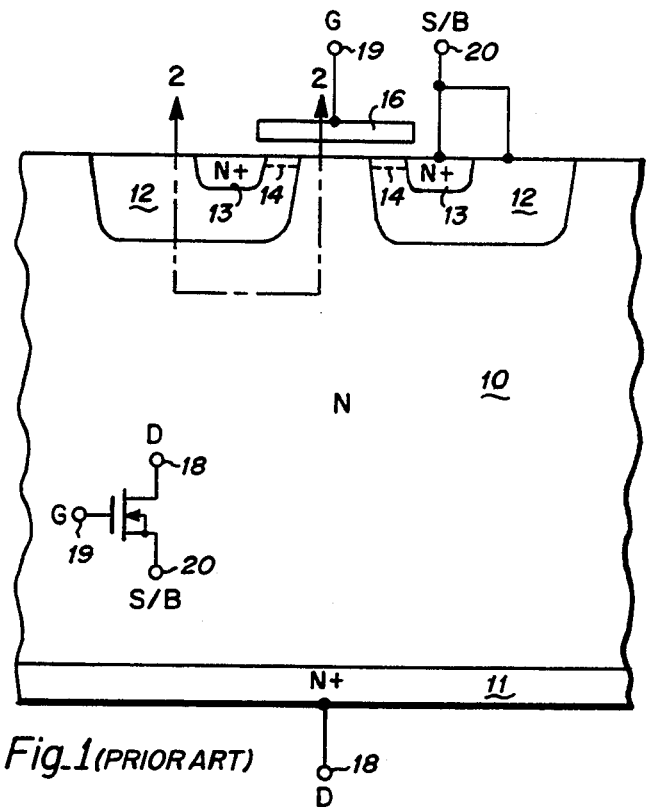
Fig_1 (PRIOR ART)
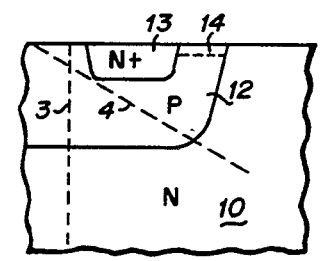
Fig_2 (PRIOR ART)
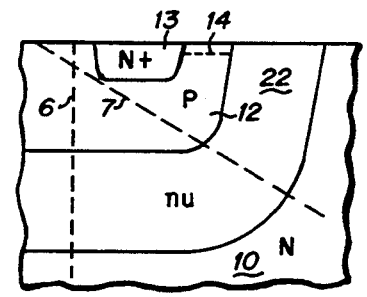
Fig_5
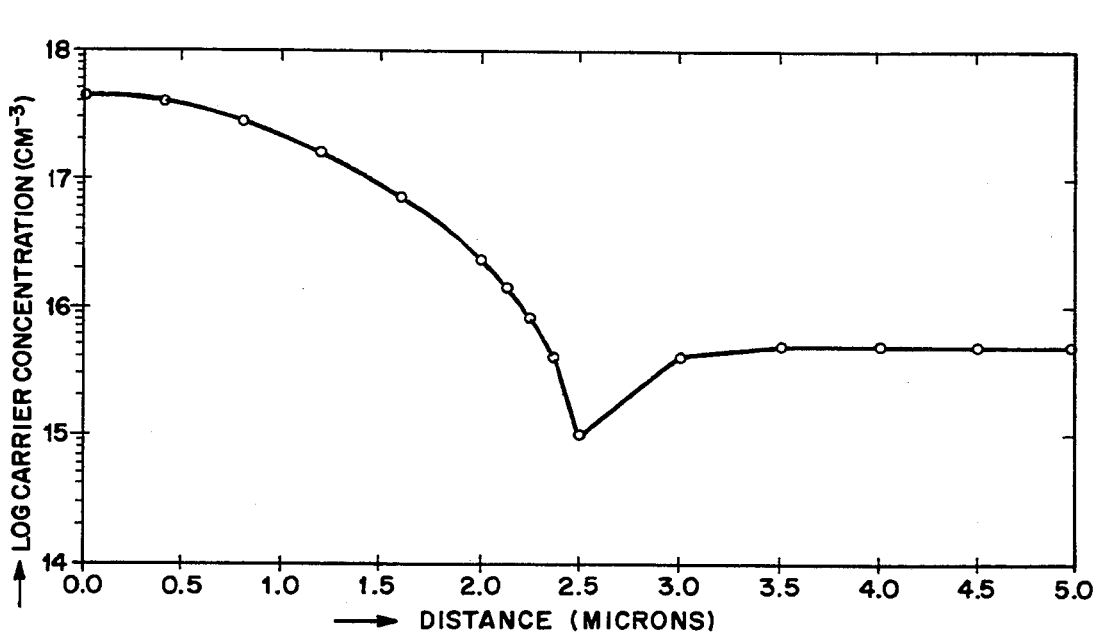
Fig_3 (PRIOR ART)

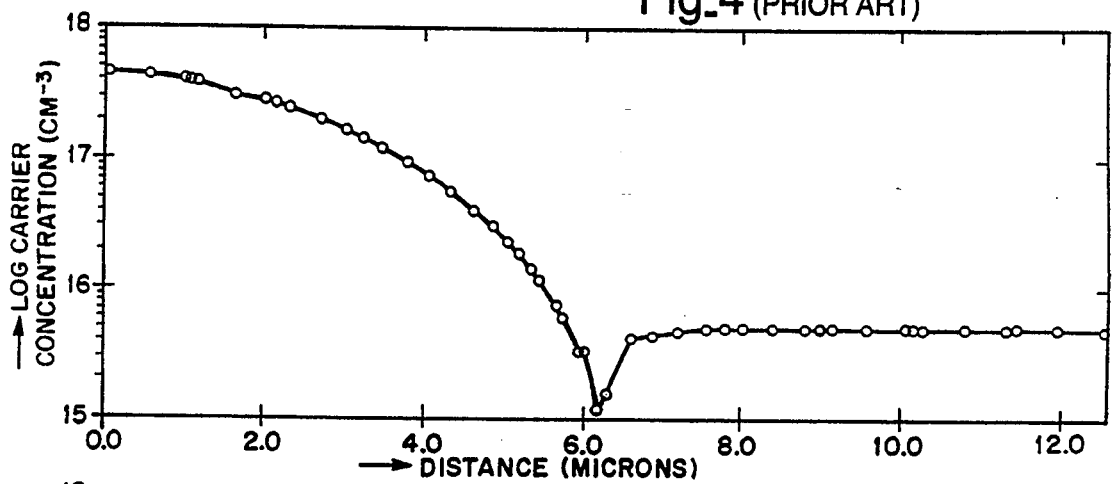
Fig_4 (PRIOR ART)
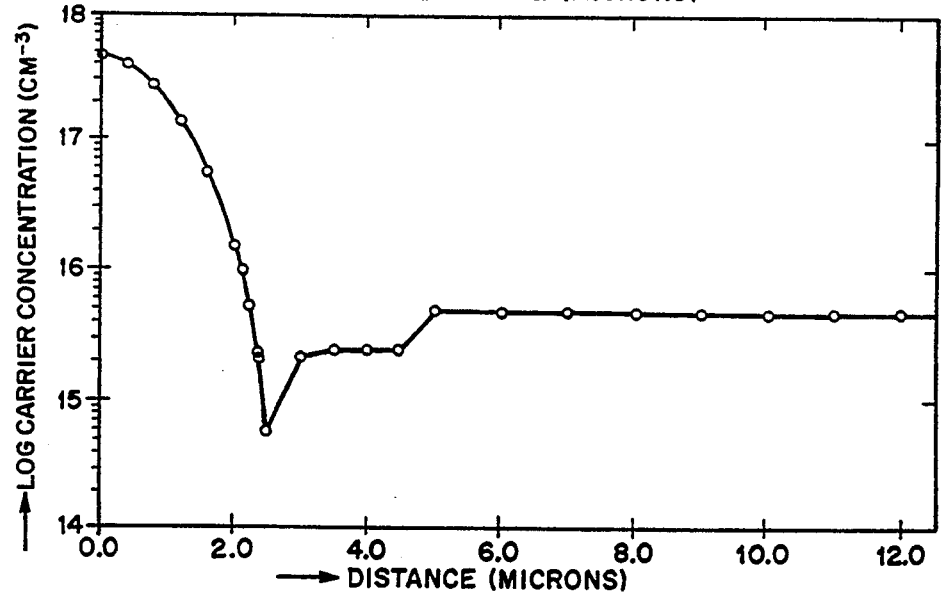
Fig_6
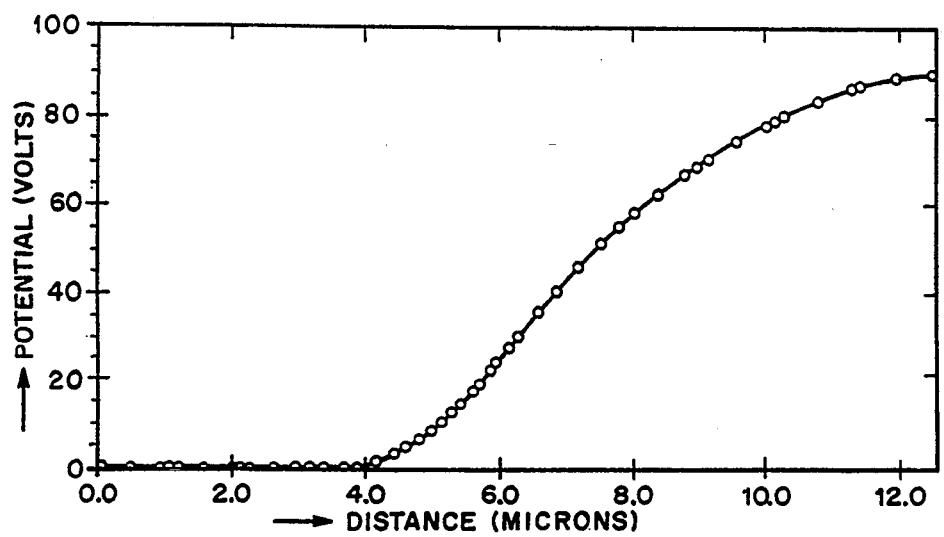
Fig_9

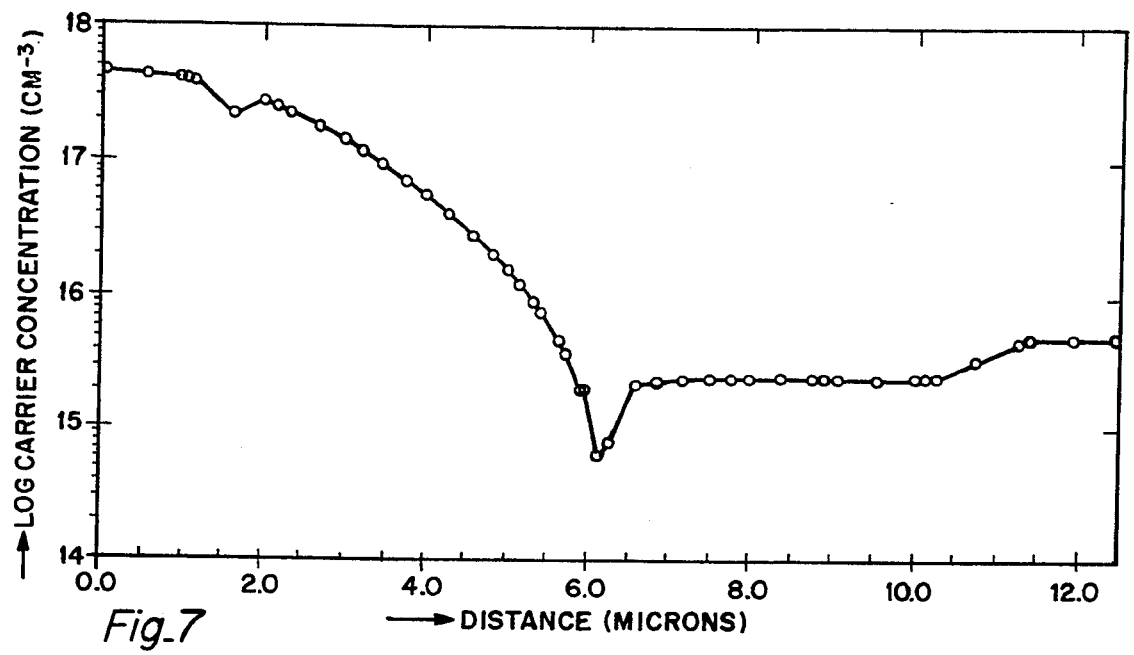
Fig_7
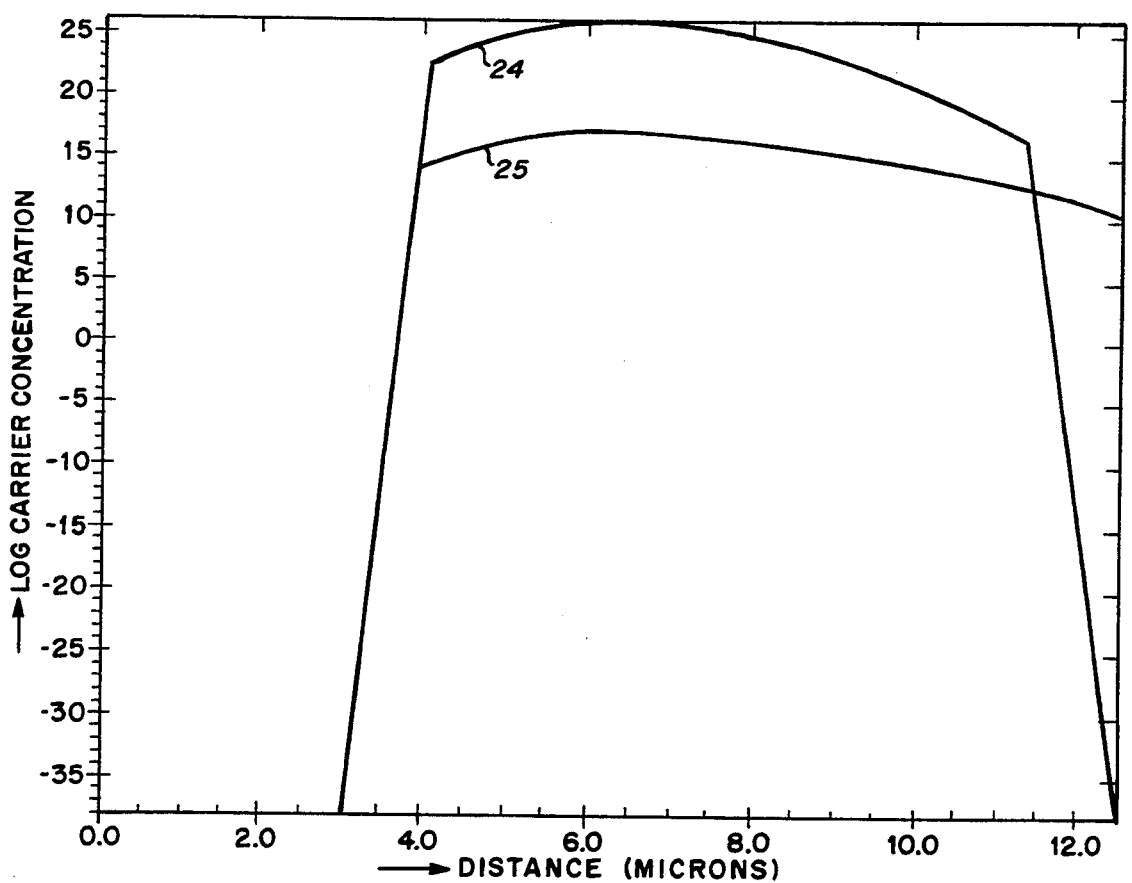
Fig_11

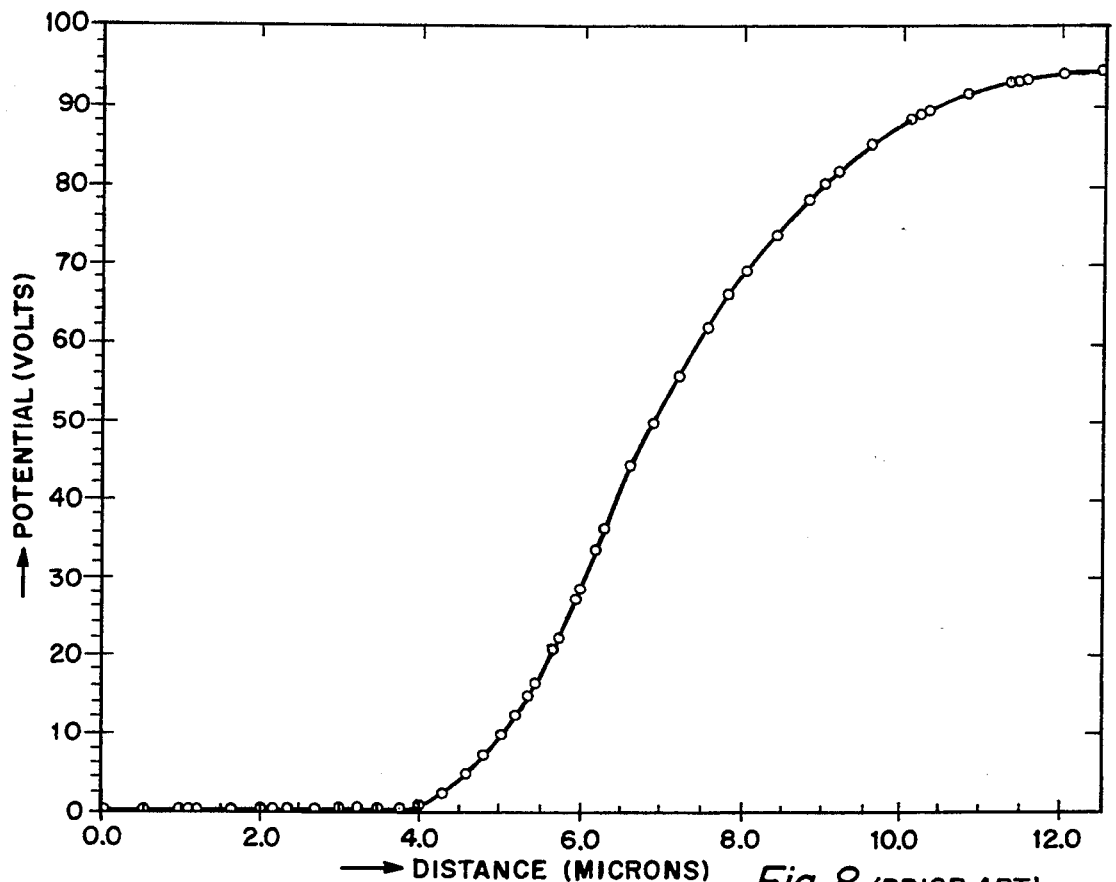
Fig_8 (PRIOR ART)
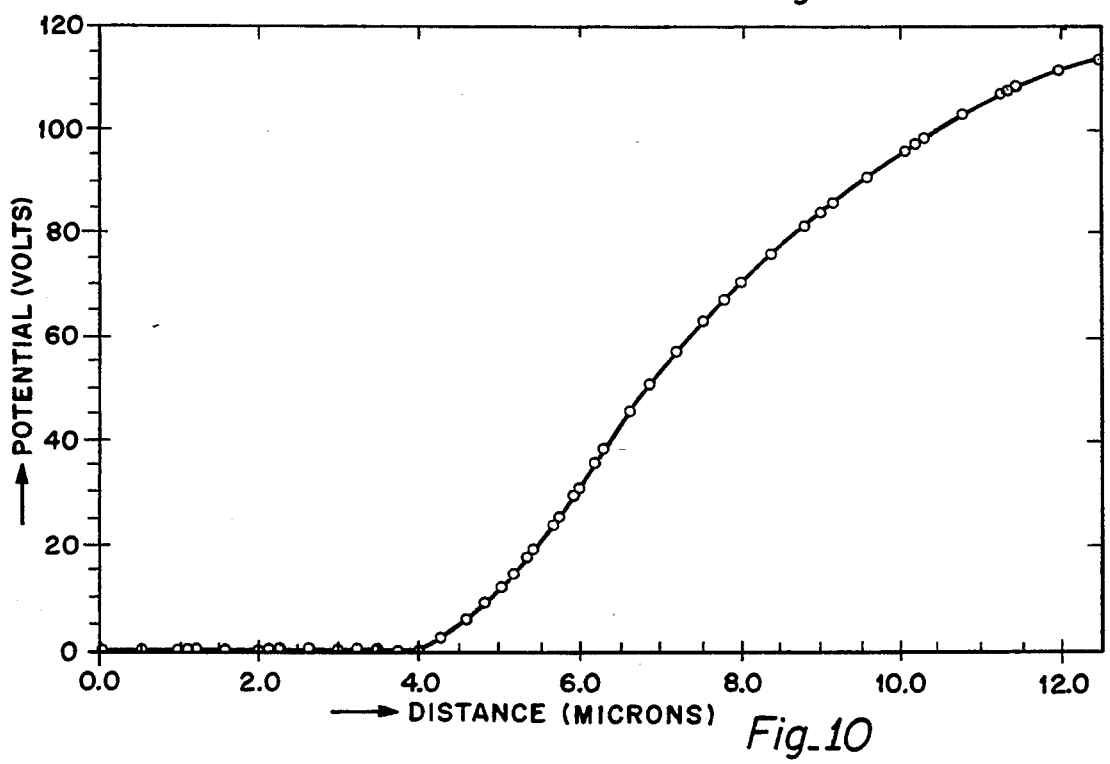
Fig_10

DMOST JUNCTION BREAKDOWN ENHANCEMENT

This application is a continuation of application Ser. No. 07/822,333, filed Jan. 16, 1992 abandoned.

BACKGROUND OF THE INVENTION

The invention relates to a diffused metal oxide semiconductor transistor (DMOST) structure and specifically relates to a means for increasing the drain breakdown voltage in devices that are limited by avalanche breakdown. This is the limiting voltage breakdown mechanism where the device dimensions are made large enough to preclude punch through or reach through of the electric field depletion region. Avalance breakdown occurs when the semiconductor internal electric field gradient exceeds a value that results in spontaneous carrier generation. Once this action starts the thus-created carriers are accelerated in the electric field and, by collisions with the semiconductor crystal lattice, generate additional carriers. When the carrier generation ratio becomes greater than unity the process is regenerative and will rapidly proceed towards infinity. This form of breakdown interrupts normal device operation and results in a critical voltage limitation for the device.

FIG. 1 shows a typical cross section of a vertical DMOST employed in the semiconductor industry. The vertical dimensions of the drawing have been exaggerated with respect to the horizontal dimensions for clarity. The device employs conventional planar construction. The semiconductor drain layer 10 can be a well known epitaxial semiconductor layer of N type conductivity located upon an N+ substrate 11. This N+ substrate can be a heavily doped semiconductor wafer where the DMOST is to be produced as a discrete element. Alternatively, layer 11 can be a buried conductive layer of heavily doped material as is well known in the monolithic semiconductor integrated circuit art. At the surface of the semiconductor layer 10 a planar junction region 12 is created by diffusing a P type impurity therein. While a cross-section is shown in FIG. 1, P region 12 is actually in the form of a ring that can have any desired surface configuration. It can be a simple circle or, as is more commonly employed, it can be hexagonal in shape so that a plurality of such elements can be nested together on a semiconductor wafer surface. The plurality of such elements are connected in parallel by planar device metallization so that they act together as a single element. While each of the elements conduct only a relatively small current, enough such elements can be employed in parallel to provide a desired current value. In practice, several thousand such elements can be connected together to provide many amperes of current.

Inside region 12 a second N+ conductivity source region 13 is diffused into the semiconductor surface as shown. Region 13 extends part way through region 12 and its inner edge is spaced from the inner edge of region 12 so that a controlled spacing is achieved. Dashed lines 14 span this spacing and serve to define the DMOST channel region. Gate metallization 16 spans the channel region and actually extends slightly over the periphery of region 13. The gate metallization is shown suspended over the surface of the semiconductor, but is in fact, located on top of a thin gate oxide. The planar oxide, as well as the conventional planar metallization, is not shown in FIG. 1. Their omission is for the purpose of improving the clarity of the drawings and it is to be understood that such planar artifacts are indeed present. The thickness of the oxide layer under gate metallization is controlled in the fashion of conventional MOST practice to control the DMOST threshold voltage $V_T$.

If a positive potential is applied to metal 15 it will act to repel the majority P type carriers and attract N type minority carriers in region 12 just under the thin oxide. This action, at some voltage level determined by the oxide thickness and the doping level in the channel region, will drive the P type region into its inverted state thus creating a channel region that is defined by dashed lines 14.

The device electrodes are shown schematically. The source contact is made to region 13 and a parallel connection to region 12 forms the DMOST body connection. Thus, terminal 20 is the SOURCE/BODY electrode, terminal 19 is the GATE electrode and terminal 18, which is made to region 11, is the DRAIN electrode. Thus, the DMOST has its body 12 (or backgate) shorted to its source 13 as shown in the associated schematic diagram.

In a typical DMOST construction layer 11 is a heavily doped semiconductor wafer and the drain contact 18 is made to the opposite wafer face as shown. Alternatively, layer 11 is a conductive buried layer about a micron thick located upon a P type semiconductor substrate wafer in accordance with monolithic integrated circuit practice. N type layer 10 is typically made about 14 microns thick and region 12 extends about 2.5 microns into the surface. Region 13 extends for about a micron into region 12. P type body region 12 typically has a surface carrier concentration of about $3.5 \times 10^{17}/cm^3$. Region 10 has a uniform carrier concentration of about $5 \times 10^{15}/cm^3$. Region 11 has a carrier concentration of about $5 \times 10^{18}/cm^3$, which provides a low resistance ohmic area contact to drain region 10. For the above-mentioned conditions, the drain reach-through voltage from region 12 is greater than 120 volts. However, for the carrier concentration in region 10, the avalanche voltage will be lower than the reach-through.

In a well known alternative embodiment of the vertical DMOST, the semiconductor surface lying inside the inner periphery of region 12 can be made to have a reduced conductivity.

Further, with respect to the prior art, FIG. 2 is a simplified cross-section of the junction portion of FIG. 1, as defined by dashed line 2. In FIG. 2, dashed line 3 extends vertically through the junction structure and FIG. 3 is a graph that plots typical carrier concentration along this line. It can be seen that the junction is located about 2.5 microns below the surface. To the left of the junction P type material in region 12 is present and to the right the N type material of region 10 exists. It will be noted that the doping in region 10 is uniform as a result of epitaxial deposition while body region 12, which is a planar diffusion, is exponential.

Dashed line 4 of FIG. 2 is angled at about 22 degrees with respect to the surface and represents an expanded plot of carrier concentration as shown in the graph of FIG. 4. This graph extends for over 12 microns and shows the PN junction location at 6 microns. The purpose of the angle is to expand the profile and FIG. 4 represents an actual device plot using an angle-lapped specimen.

SUMMARY OF THE INVENTION

It is an object of the invention to increase the avalanche voltage in a DMOST drain.

It is a further object of the invention to incorporate a region of reduced impurity concentration into a DMOST drain thereby to reduce the electric field gradient under reverse biased drain conditions.

It is a still further object of the invention to surround the DMOST body region with an opposite conductivity type region having reduced impurity concentration.

These and other objects are achieved as follows. A DMOST body region is formed in a uniform resistivity drain region and a reduced-concentration drain region is formed to surround the body. This results in reduced electric field gradients in the vicinity of the PN junction and this, in turn, reduces the generation of carriers under applied bias conditions. The result is to increase the avalanche voltage which is the limiting device parameter.

BRIEF DESCRIPTION OF THE DRAWING

FIG. 1 is a fragmentary cross-section of a semiconductor wafer containing a prior art DMOST transistor element.

FIG. 2 is a simplified cross-section of the PN junction portion of FIG. 1.

FIG. 3 is a graph showing the carrier concentration versus distance along dashed line 3 of FIG. 2.

FIG. 4 is a graph showing the carrier concentration versus distance along angled dashed line 4 of FIG. 2.

FIG. 5 is a simplified cross-section showing the PN junction structure of the invention.

FIG. 6 is a graph showing the carrier concentration versus distance along dashed line 6 of FIG. 5.

FIG. 7 is a graph showing the carrier concentration versus distance along dashed angled line 7 of FIG. 5.

FIG. 8 is a graph plotting potential versus distance along line 4 of FIG. 2 at a DMOST drain potential of 91 volts.

FIG. 9 is a graph plotting potential versus distance along dashed line 7 of FIG. 5 at a DMOST drain potential of 91 volts.

FIG. 10 is a graph plotting potential versus distance along line 7 of FIG. 5 at a DMOST drain potential of 116 volts.

FIG. 11 is a graph plotting the generation of carriers along line 4 of FIG. 2 and line 7 of FIG. 5 at a DMOST drain potential of 91 volts.

DESCRIPTION OF THE INVENTION

FIG. 5 discloses the invention. A "nu" region 22 has been added to the basic structure, shown in FIG. 2, to create what is called a P-nu-N structure. The nu region is of N conductivity type, but is more lightly doped than N region 10. Such a region can be created by preceding the formation of P region 12 using the planar photolithographic process with a suitable set of process steps. For example, in preparing a prior art planar DMOST, an oxide mask is photolithographically created to produce P type body region 12. This mask is actually an opening in the planar oxide through which P type impurities will be diffused into the silicon. In accomplishing the invention, the mask opening is first utilized to localize a deposit of P type impurities, such as boron, which is deposited in a controlled quantity. The doping level is selected so that the impurities in region 10 are partially compensated, but not enough impurities are applied to create a PN junction. The impurities are then diffused at a temperature that will drive them into the semiconductor sufficiently to create nu region 22. Then, the same photolithographically created oxide mask is employed to create region 12 conventionally.

FIG. 6, which plots the carrier concentration along dashed line 6 of FIG. 5, shows the nu region as a lower N type doping (due to compensation) adjacent to the PN junction at 2.5 microns. Note that N region 10 is doped at about $5 \times 10^{15}$ atoms/cm$^3$ and the nu region 22 is doped at about $2.5 \times 10^{15}$ atoms/cm$^3$, or about half of the drain layer 10 doping. This occurs when half of the original atoms are compensated. Then, in the planar process, body region 12 is created normally by oxide masked diffusion to produce a surface doping level of about $3.5 \times 10^{17}$ atoms/cm$^3$. This diffusion is accomplished through the same oxide mask used to produce the nu region 22, but is done at a lower temperature so that the impurity penetration is less as illustrated.

FIG. 7 is a graph showing the impurity profile of the invention on an expanded scale. It follows dashed line 7 of FIG. 5. Since this profile is angled at about 23 degrees from the surface the PN junction occurs at about 6 microns and the nu region extends to about 11 microns. The slight bump at the left is due to a close encounter with region 13 of FIG. 5.

FIG. 8 is a graph plotting the potential along dashed line 4 of FIG. 2 when the PN junction is biased at 91 volts which is close to its avalanche breakdown. Note that the depletion region extends to 4 microns which is well inside the PN junction itself at 6 microns. Note that the potential gradient is maximum at the PN junction which is where the most carriers are generated. This is the location where the avalanche breakdown starts out. If the field gradient is sufficient, the carriers will achieve sufficient velocity to produce secondary carriers and, thus, build up a current that can regenerate itself and produce junction breakdown when the carrier reproduction ratio exceeds unity.

FIG. 9 is a graph, similar to FIG. 8, but is a plot of the potential along the line 7 of FIG. 5 to illustrate the nature of the invention. The PN junction of FIG. 5, as described above, will have an avalanche breakdown of about 116 volts. FIG. 9 shows the curve when the device is biased at the level of the FIG. 8 graph. It can be seen that the field gradient at 6 microns is substantially reduced which accounts for the higher breakdown. To complete the comparison, FIG. 10 is a graph showing the potential plot along dashed line 7 of FIG. 5 when biased at 116 volts or close to breakdown. It can be seen that the gradient at 6 microns is close to that of FIG. 8. Thus, in both FIGS. 8 and 10, the carrier production will be about the same even though FIG. 10 is operated at a 27 percent higher voltage.

The actual generation of carriers provides a more dramatic comparison of the invention with the prior art. FIG. 11 is a graph that plots carrier generation as a function of distance. Curve 24 is a plot of the carrier generation associated with the graph of FIG. 8 (the prior art) and curve 25 is a plot of carrier generation associated with the graph of FIG. 9 (the invention). It will be noted that at 91 volts reverse bias, the depletion region extends about three microns into the P type portion 12 and that the peak carrier generation occurs at the PN junction at 6 microns. For the conditions shown, the invention results in over nine orders of magnitude less carrier generation at the PN junction.

The improvement detailed above is present when nu region 22 is doped at one-half of that of N region 10. A still further improvement results if the doping is further reduced. When the nu region 22 is further doped to one-fourth the level of N region 10, the avalanche breakdown is increased to 127 volts, which is a 40% improvement. However, since the invention employs compensation to lower the doping of nu region 22, as the doping approaches intrinsic, it becomes increasingly difficult to control in a production process. If the nu region is caused to revert to P type, the device behavior reverts to the avalanche breakdown voltage of the prior art.

The invention has been described and a preferred embodiment detailed. Alternatives have also been described. When a person skilled in the art reads the foregoing description, still other alternatives and equivalents, within the spirit and intent of the invention, will be apparent. Accordingly it is intended that the scope of the invention be limited only by the claims that follow.

We claim:

1. A diffused metal oxide semiconductor transistor having a first diffused body region of a first conductivity type facing an epitaxial drain region of the opposite conductivity type to produce a PN junction that is reverse biased in normal operation and said PN junction has a breakdown voltage that is determined by avalanche carrier production, said epitaxial drain region of said opposite conductivity type comprising:

A second diffused region of the same conductivity type as said epitaxial drain region, wherein said second diffused region completely encompasses said first diffused body region, said second diffused region having a thickness substantially less than that of said epitaxial drain region, and said second diffused region has reduced conductivity as compared to said epitaxial drain region, whereby said breakdown voltage, at which said avalanche carrier production occurs, is increased relative to a structure lacking said second diffused region.

2. The diffused metal oxide semiconductor transistor of claim 1 wherein said transistor is of vertical construction and comprises conventional planar elements.

3. The diffused metal oxide semiconductor transistor of claim 1 wherein said second diffused region has a thickness approximating that of said first diffused body region.

4. The diffused metal oxide semiconductor transistor of claim 1 wherein said first conductivity type is P and said opposite conductivity type is N.

5. A diffused metal oxide semiconductor transistor having an improved breakdown voltage characteristic as compared to a conventional metal oxide semiconductor transistor, comprising:

a crystal substrate having an epitaxial layer thereover, said epitaxial layer having the same conductivity type as said crystal substrate;

a first region in said epitaxial layer of similar conductivity type to said epitaxial layer, said first region having a depth substantially less than the thickness of said epitaxial layer, said first region having reduced conductivity as compared to said epitaxial layer; and a second region in said first region of opposite conductivity type from said first region, said second region having a depth less than but approximating the thickness of said first region, said first region providing a higher resistivity path from said second region to said epitaxial layer than a structure lacking said first region, thereby improving the breakdown voltage.

6. A diffused metal oxide semiconductor transistor as set forth in claim 5, wherein said transistor is of vertical construction and comprises conventional planar elements.

7. A diffused metal oxide semiconductor transistor as set forth in claim 5, wherein said first region and said second region are diffused.

8. A diffused metal oxide semiconductor transistor as set forth in claim 5, wherein said epitaxial layer has a reduced conductivity as compared to said crystal substrate.

9. A diffused metal oxide semiconductor transistor as set forth in claim 5, wherein said crystal substrate is of N+ type silicon, said epitaxial layer is of N type silicon and said second region is of P type silicon.

* * * * *